(12) United States Patent
Chu

(10) Patent No.: US 6,291,299 B1
(45) Date of Patent: Sep. 18, 2001

(54) METHOD FOR MAKING MOS TRANSISTORS

(75) Inventor: Charles Chu, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/419,766

(22) Filed: Oct. 14, 1999

(51) Int. Cl.$^7$ .................................................. H01L 21/336
(52) U.S. Cl. .......................... 438/290; 438/163; 438/184; 438/199; 438/689
(58) Field of Search .................... 438/163, 184, 438/199, 290, 689

(56) References Cited

U.S. PATENT DOCUMENTS 4,708,904 * 11/1987 Shimizu et al. .................. 428/209
5,672,541 * 9/1997 Booske et al. .................... 438/513
6,136,669 * 10/2000 Flitsch et al. .................... 438/466

OTHER PUBLICATIONS

Chapter 15, Wet Processing: Cleaning; Etching; Lift–Off of "Silicon processing For the VLSI Era" vol. 1, by Wolf and Tauber, Lattice Press, California.*

* cited by examiner

*Primary Examiner*—Charles Bowers
*Assistant Examiner*—Asok Kumar Sarkar
(74) *Attorney, Agent, or Firm*—Mark Seeley

(57) ABSTRACT

An improved method of forming an MOS transistor, which includes forming a polysilicon layer on a silicon dioxide layer, which is formed on a substrate. After etching the polysilicon and silicon dioxide layers to define a gate electrode and a gate oxide, dopants are implanted into the substrate. Following that implantation step, the exposed portion of the gate oxide is cleaned and sealed.

16 Claims, 2 Drawing Sheets

METHOD FOR MAKING MOS TRANSISTORS

FIELD OF THE INVENTION

The present invention relates to a method for making MOS transistors, in particular, those with very thin gate oxides and very shallow LDD junctions.

BACKGROUND OF THE INVENTION

To make an MOS transistor, a polysilicon layer is formed on a thin silicon dioxide layer, which was previously formed on a silicon wafer. Those layers are then etched to define the transistor's gate electrode and gate oxide. That etch step exposes the gate oxide corner. Exposing that corner subjects the gate oxide to various impurities that may contaminate the oxide. Such contaminants may be present in the fabrication environment and in the materials and equipment used to process the wafer. If the gate oxide remains exposed during subsequent processing (e.g., up through the lightly doped drain ("LDD") process steps), such process steps may damage the oxide in addition to contaminating it. Unless treated, such contamination/damage can degrade the exposed gate oxide corner, possibly causing it to breakdown.

The gate oxide corner can be protected from the potentially harmful effects of subsequent process steps by reoxidizing the silicon and the polysilicon after the etch step. Such an oxidation step, however, should not be used when making MOS transistors with very shallow LDD junctions. To make such a device, very low energies should be used for the LDD implants. At such energies, those implants may not adequately penetrate through such an oxide layer. Increasing the energy to enable adequate penetration through the oxide may not solve that problem. If the energy is increased to compensate for the surface oxide, such a relatively high implant energy may cause excessive deep scattering of the dopants. This may generate a relatively deep junction, which is unacceptable for deep sub-micron devices.

As an alternative to protecting the gate oxide corner prior to subsequent processing, the polysilicon and the silicon may be reoxidized afterwards, e.g., after the LDD implant steps. Unfortunately, such a process step causes oxidation enhanced diffusion of the LDD implants, which creates LDD junctions that may be too deep.

Accordingly, there is a need for a process for making an MOS transistor having very thin oxides and very shallow LDD junctions that protects the gate oxide corner without degrading the device's short-channel performance. The present invention provides such a process.

SUMMARY OF THE INVENTION

An improved method for making an MOS transistor is described. That method comprises forming a polysilicon layer on a silicon dioxide layer, which is formed on a substrate. The polysilicon and silicon dioxide layers are then etched to define a gate electrode and a gate oxide. After that etching step, dopants are implanted into the substrate. The exposed portion of the gate oxide is then cleaned and sealed.

DETAILED DESCRIPTION OF THE PRESENT INVENTION

Figure 1:
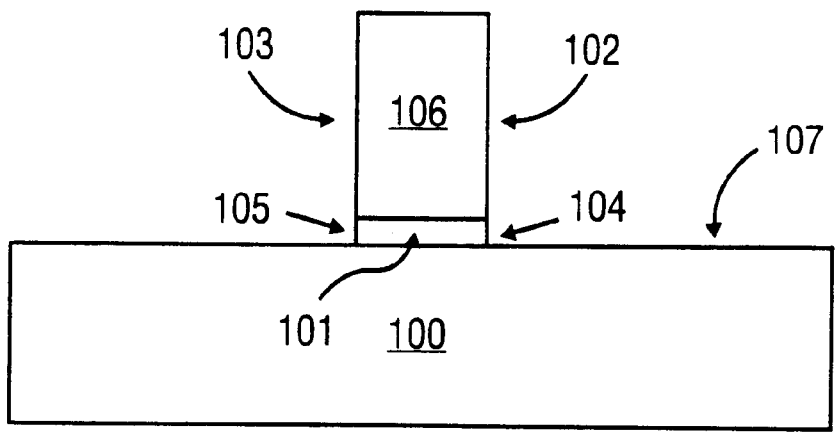
FIG. 1 represents a cross-section of a device in which gate oxide corners are exposed.

An improved method for making an MOS transistor is described. In that method, the surface of a silicon wafer is cleaned prior to forming on that surface a thin silicon dioxide layer, which will be used to form the gate oxide. A polysilicon layer is then formed on that silicon dioxide layer. The polysilicon and silicon dioxide layers are then etched to define upon substrate 100 a gate electrode and gate oxide 101—as shown in FIG. 1. Exposed portions 102, 103 of etched polysilicon layer 106 and gate oxide 101 include exposed gate oxide corners 104 and 105.

In a preferred embodiment of the present invention, gate oxide 101 is less than or equal to about 30 angstroms thick and etched polysilicon layer 106 defines a gate electrode having a length that is less than or equal to about 0.18 micron. More preferably, gate oxide 101 is between about 10 and about 25 angstroms thick and etched polysilicon layer 106 defines a gate electrode having a length that is between about 0.07 and about 0.18 micron. When conventional cleaning steps follow the etch step, essentially all oxide is removed from uncovered portions 107 of the wafer.

Figure 2:
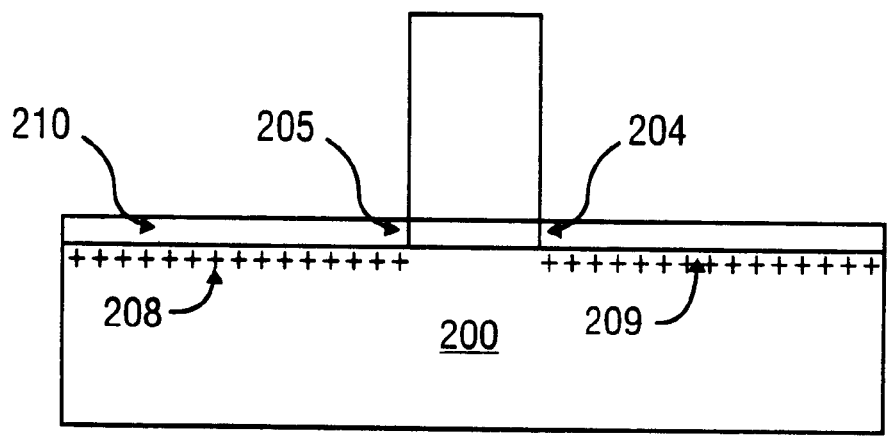
FIGS. 2 represents a cross-section of the FIG. 1 device after dopants have been implanted into the substrate.

After the etch step, native oxide 210 will grow on surface 209 of bare silicon 200, as shown in FIG. 2. Native oxide 210 will absorb various contaminants. Dopants are implanted through native oxide 210 into substrate 200 to form LDD region 208. To form transistors with gate lengths that are less than or equal to about 0.18 micron, the LDD implant should penetrate a very small distance into substrate 200. Otherwise, subsequent heating steps could cause the implanted regions to diffuse too far underneath the gate, which may adversely affect the device's electrical properties. For P-channel devices, boron is generally used to dope the substrate. For N-channel devices, arsenic is generally employed.

To ensure that the dopants will not penetrate too far into the substrate, boron should be implanted at an energy that is less than or equal to about 4 KeV (more preferably between about 0.2 and about 1 KeV for B11, and between about 2 and about 4 KeV for $BF_2$); and arsenic should be implanted at an energy that is less than or equal to about 5 KeV (more preferably between about 2 KeV and about 5 KeV). If phosphorus is used instead of arsenic for the n-type LDD implant, the implant should use an energy that is less than or equal to about 4 KeV (more preferably between about 1 KeV and about 2 KeV). FIG. 2 represents the FIG. 1 structure after a p-type LDD implant. The designation "+" represents the implantation of p-type dopants (e.g., boron) into the uncovered silicon regions.

Leaving gate oxide corners 204, 205 exposed during the LDD implant, as well as during photoresist deposition and removal steps and any subsequent HALO implant step, may cause those corners to become contaminated and/or damaged. If left untreated, such contamination and/or damage can degrade the gate oxide corners, potentially causing them to breakdown. To prevent this from occurring, the present invention employs a robust cleaning process, after the LDD implant step. That cleaning step should remove contaminated materials from the surface of the gate oxide corners, the adjacent polysilicon edge, and the adjacent silicon. The cleaning step preferably should take place after completing both n-type and p-type LDD implants and just prior to encapsulating the gate oxide with a spacer film.

In a preferred embodiment of the present invention, the cleaning process includes steps for removing contaminated native oxide and residual organic and/or metallic material. Such a process may employ a three step wet clean process. First, a conventional HF wet dip is used to remove contaminated native oxide. That step preferably comprises dipping the wafer into a 50:1 $H_2O$:HF solution for about 30 seconds. Next, the wafer is bathed in a dilute $NH_4OH$:$H_2O_2$:$H_2O$ solution, preferably about 5 parts $H_2O$ to about 1 part each $NH_4OH$ and $H_2O_2$, for about 12 minutes to remove any residual organic material. Finally, residual metallic materials are removed by bathing the wafer in a dilute HCl:$H_2O_2$:$H_2O$ solution, preferably about 5 parts $H_2O$ to about 1 part each HCl and $H_2O_2$, for about 12 minutes.

Figure 3:
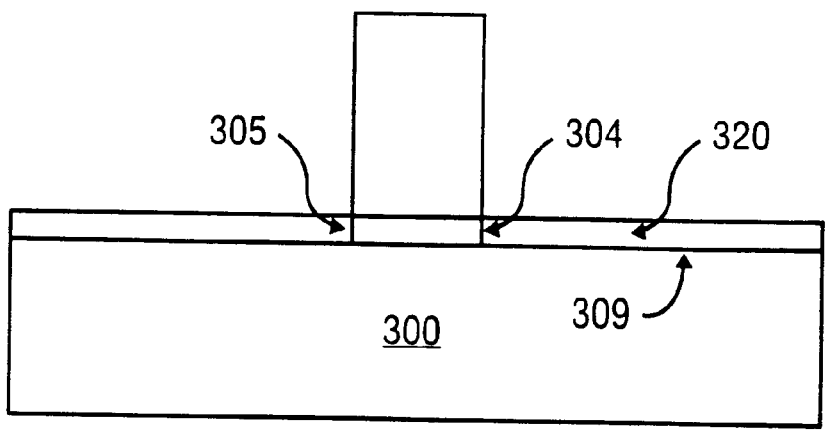
FIG. 3 represents a cross-section of the FIG. 2 device after a cleaning step and formation of a clean chemical oxide.

Conventional process equipment may be used to carry out these three separate cleaning steps. In a preferred embodiment of the present invention, essentially the same equipment, materials and process steps used to clean the wafer prior to forming the gate oxide layer may be used for this cleaning step. During these cleaning steps, a thin layer of clean chemical oxide 320 grows on surface 309 of silicon substrate 300, as shown in FIG. 3. Growth of such a clean chemical oxide enables at least part of gate oxide corners 304, 305 to be protected from contamination and degradation—without requiring additional thermal oxide processing.

Figure 4:
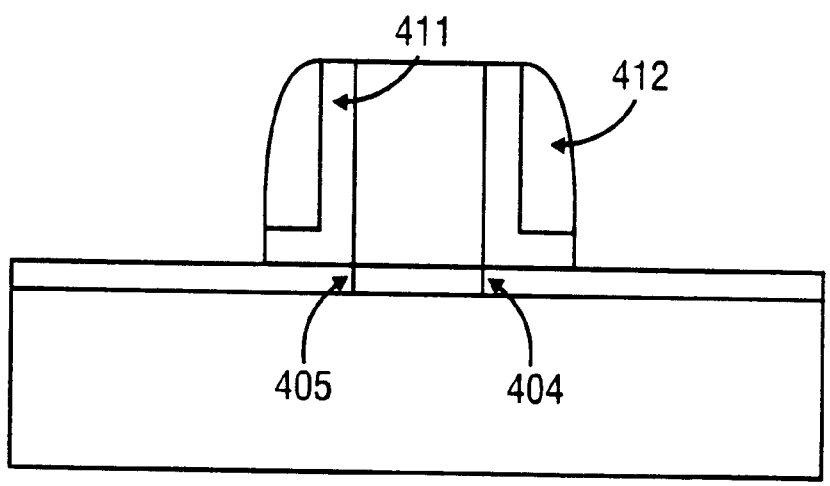
FIG. 4 represents a cross-section of the FIG. 3 device after the gate oxide is sealed.

After those cleaning and chemical oxide growth steps, conventional process steps may follow. Such steps may include, for example, depositing a silicon dioxide layer onto the sides of the etched polysilicon layer and onto the surface of the chemically grown oxide layer, then depositing a silicon nitride containing layer over the resulting structure. The silicon dioxide layer may be formed using a conventional hot wall process that employs TEOS as the silicon dioxide source. The device that results after a subsequent etch step (or steps), which removes the silicon nitride and oxide layers, is shown in FIG. 4. Silicon dioxide layer 411 and silicon nitride spacer 412 seal gate oxide corners 404, 405.

The method of the present invention protects the gate oxide corners without causing the LDD implant to diffuse too far into the substrate, which could adversely affect the device's short-channel performance. In the preferred embodiment described above, adding a three stage wet clean step to a conventional process for making an MOS transistor should provide a simple, cost effective, and robust way to remove contamination that the processing environment may introduce, and to cure damage that certain process steps can cause.

Cleaning the gate oxide corners in this way, after all LDD processing is completed, eliminates the need for a thermal oxide growth step prior to the LDD implant step. Eliminating that step enables the LDD junction depth to be maintained at the desired level because excessive implant energy is not required to penetrate any such oxide. The implant energy only must be sufficient to penetrate the native oxide. In addition, by using a clean chemical oxide to protect at least part of the gate oxide corners prior to spacer formation, a thermal oxidation step need not follow the LDD implant. Consequently, the process of the present invention enables the gate oxide to be protected, without requiring any DT increase or any increase in LDD junction depth.

Features shown in the above referenced drawings are not intended to be drawn to scale, nor are they intended to be shown in precise positional relationship. Additional process steps that may be used to make the embodiments described above have been omitted when not useful to describe aspects of the present invention.

Although the foregoing description has specified certain steps, materials, and equipment that may be used to make MOS transistors, those skilled in the art will appreciate that many modifications and substitutions may be made. Accordingly, it is intended that all such modifications, alterations, substitutions and additions be considered to fall within the spirit and scope of the invention as defined by the appended claims.

What is claimed is:

1. A method of forming an MOS transistor comprising:
   forming a polysilicon layer on a silicon dioxide layer, which is formed on a substrate; then
   etching the polysilicon and silicon dioxide layers to define a gate electrode and a gate oxide such that the gate oxide corners are exposed; then
   implanting dopants into the substrate through a native oxide that has grown on the substrate; then
   cleaning the exposed gate oxide corners; then sealing those exposed corners.

2. The method of claim 1 wherein the etched polysilicon layer defines a gate electrode having a length that is less than or equal to about 0.18 micron.

3. The method of claim 1 wherein the gate oxide is less than or equal to about 30 angstroms thick.

4. The method of claim 1 wherein the dopants are implanted at an energy that is less than or equal to about 5 KeV.

5. The method of claim 1 wherein the cleaning comprises steps for removing contaminated native oxide, residual organic material, and residual metallic material.

6. The method of claim 5 further comprising forming a clean chemical silicon dioxide layer on the substrate when cleaning the exposed gate oxide corners and prior to sealing those exposed corners.

7. The method of claim 5 wherein the step for removing contaminated native oxide comprises dipping the substrate into an HF containing solution; the step for removing residual organic material comprises bathing the substrate in a dilute $NH_4OH$:$H_2O_2$:$H_2O$ solution; and the step for removing residual metallic material comprises bathing the substrate in a dilute HCl:$H_2O_2$:$H_2O$ solution.

8. The method of claim 1 wherein the sealing step comprises forming a spacer on the sides of the etched polysilicon layer.

9. The method of claim 8 wherein the spacer is formed by depositing a silicon dioxide layer on the sides of the etched polysilicon layer, then depositing a nitride layer on the sides of that silicon dioxide layer.

10. The method of claim 9 wherein the silicon dioxide layer is deposited using a hot wall process that employs TEOS as the silicon dioxide source.

11. A method of forming an MOS transistor comprising:
    forming a silicon dioxide containing layer that is less than or equal to about 30 angstroms thick on a silicon containing substrate; then forming a polysilicon layer on the silicon dioxide containing layer; then
    etching the polysilicon and silicon dioxide containing layers to define a gate electrode, having a length that is less than or equal to about 0.18 micron, and a gate oxide such that the gate oxide corners are exposed; then
    implanting dopants into the substrate through a native oxide that has grown on the substrate at an energy that is less than or equal to about 5 KeV; then
    cleaning the exposed gate oxide corners; then forming a clean chemical silicon dioxide layer on the substrate; then sealing the exposed gate oxide corners.

12. The method of claim 11 wherein the cleaning comprises:

dipping the substrate into an HF containing solution;

bathing the substrate in a dilute $NH_4OH:H_2O_2:H_2O$ solution; and bathing the substrate in a dilute $HCl:H_2O_2:H_2O$ solution.

13. The method of claim 12 wherein the sealing comprises depositing a silicon dioxide layer on the sides of the etched polysilicon layer, then depositing a nitride layer on the sides of that silicon dioxide layer.

14. The method of claim 13 wherein the silicon dioxide layer is deposited using a hot wall process that employs TEOS as the silicon dioxide source.

15. A method of forming an MOS transistor comprising:

forming a silicon dioxide containing layer that is less than or equal to about 30 angstroms thick on a silicon containing substrate; then forming a polysilicon layer on the silicon dioxide containing layer; then etching the polysilicon and silicon dioxide containing layers to define a gate electrode, having a length that is less than or equal to about 0.18 micron, and a gate oxide such that the gate oxide corners are exposed; then implanting dopants into the substrate through a native oxide that has grown on the substrate at an energy that is less than or equal to about 5 KeV; then dipping the substrate into an HF containing solution;

bathing the substrate in a dilute $NH_4OH:H_2O_2:H_2O$ solution;

bathing the substrate in a dilute $HCl:H_2O_2:H_2O$ solution; then forming a clean chemical silicon dioxide layer on the substrate;

depositing a silicon dioxide layer on the sides of the etched polysilicon layer using a hot wall process that employs TEOS as the silicon dioxide source; and depositing a nitride layer on the sides of that silicon dioxide layer.

16. A method of forming an MOS transistor comprising:

cleaning a surface of a silicon containing substrate; then forming on the silicon containing substrate a silicon dioxide containing layer that is less than or equal to about 30 angstroms thick; then forming a polysilicon layer on the silicon dioxide containing layer; then etching the polysilicon and silicon dioxide containing layers to define a gate electrode, having a length that is less than or equal to about 0.18 micron, and a gate oxide such that the gate oxide corners are exposed; then implanting dopants into the substrate through a native oxide that has grown on the substrate at an energy that is less than or equal to about 5 KeV; then cleaning the substrate using essentially the same equipment, materials and process steps that were used to clean the substrate prior to forming the silicon dioxide containing layer on the substrate; then depositing a silicon dioxide layer on the sides of the etched polysilicon layer using a hot wall process that employs TEOS as the silicon dioxide source; and depositing a nitride layer on the sides of that silicon dioxide layer.

* * * * *

UNITED STATES PATENT AND TRADEMARK OFFICE
CERTIFICATE OF CORRECTION

PATENT NO. : 6,291,299 B1　　　　　　　　　　　　　　　　　　　　　　Page 1 of 1
DATED : September 18, 2001
INVENTOR(S) : Charles Chu et al.

It is certified that error appears in the above-identified patent and that said Letters Patent is hereby corrected as shown below:

Title page,
Item [75] should read as follows:
Inventors: Charles Chu, Portland, OR
Shi-Ning Yang, Portland, OR
Nuriel Amir, Har Adar, Israel
Steven Keating, Beaverton, OR
Julie Albro, Woodburn, OR Signed and Sealed this Fourteenth Day of May, 2002

*Attest:*

JAMES E. ROGAN
*Attesting Officer*　　　*Director of the United States Patent and Trademark Office*